United States Patent [19]

Ouchi

[11] 4,346,395
[45] Aug. 24, 1982

[54] LIGHT DETECTING PHOTODIODE-MIS TRANSISTOR DEVICE

[75] Inventor: Hirobumi Ouchi, Kokubunji, Japan

[73] Assignee: Hitachi, Ltd., Tokyo, Japan

[21] Appl. No.: 134,282

[22] Filed: Mar. 26, 1980

[30] Foreign Application Priority Data

Mar. 28, 1979 [JP] Japan .................. 54-35555

[51] Int. Cl.³ ........................... H01L 27/14
[52] U.S. Cl. .................... 357/30; 357/23; 357/4
[58] Field of Search .............. 357/23, 4, 30

[56] References Cited

U.S. PATENT DOCUMENTS

| 3,515,957 | 6/1970 | Kittagawa | 357/4 X |
| 3,745,072 | 7/1973 | Scott, Jr. | 357/4 X |
| 3,974,515 | 8/1976 | Ipri | 357/4 X |
| 4,242,695 | 12/1980 | Ouchi | 357/30 |

Primary Examiner—Martin H. Edlow
Attorney, Agent, or Firm—Craig and Antonelli

[57] ABSTRACT

A light detector device comprises at least one pair made up of a light sensitive photodiode and a light signal reading MIS transistor switch. The pair is formed on an insulating substrate such as sapphire. The source region of the MIS transistor switch is contiguous with a photosensitive pn junction of the photodiode. The source, drain and channel regions of the MIS transistor switch reach the insulating substrate, thereby reducing the area of pn junction of the MIS transistor and hence the junction capacitance so that high signal output is available from the photodiode with high S/N ratio.

9 Claims, 9 Drawing Figures

LIGHT DETECTING PHOTODIODE-MIS TRANSISTOR DEVICE

BACKGROUND OF THE INVENTION

This invention relates to a semiconductor light detector device, and more particularly to such a device adapted to a light detector for spectrophotometry, etc.

In conventional spectrophotometry, the light energy from a light source is dispersed or separated into its various components at different wavelengths through a suitable optical system. The dispersed light components having particular wavelengths are successively passed through a sample. The amount of each light transmitted through the sample is detected by one semiconductor light detector.

A recently proposed spectrophotometry technique uses as a light detector device an array of photodiodes which simultaneously receive the dispersed light components. The output signals from the respective photodiodes are successively delivered.

FIG. 1A of the accompanying drawings shows the circuit arrangement of a charge storage type light sensor as an example of such a photodiode array detector. FIG. 1B shows the structure of that part of FIG. 1A enclosed by a dotted block. For the illustration of FIGS. 1A and 1B, one can refer to U.S. Ser. No. 6,913 filed on Jan. 26, 1979, now U.S. Pat. No. 4,242,695, and assigned to the same assignee as the present application, in which a similar illustration is shown.

Referring to FIG. 1A, symbols $PD_1$-$PD_n$ designate n photodiodes which are arranged in correspondence with the dispersed light components or wavelengths, symbols $T_{S1}$-$T_{Sn}$ switches which include MOS transistors, symbol SR a scanning circuit which includes shift registers $SR_1$-$SR_n$, symbol $R_L$ a load resistor, and symbol $V_O$ a power supply. The switches $T_{S1}$-$T_{Sn}$ connected in series with the respective photodiodes $PD_1$-$PD_n$ respond to sampling gate pulse signals from the shift registers $SR_1$-$SR_n$ to perform the on-off control of a circuit which includes each photodiode PD, the load resistor $R_L$ and the power supply $V_O$.

Referring to FIG. 1B showing in cross section the conventional structure of a photodiode PD and a switch $T_S$ which constitute one bit of the circuit shown in FIG. 1A, a p-type light receiving region 2 of the photodiode PD and a p-type source region 3 of the switch $T_S$ are contiguously formed in one surface of an n-type semiconductor layer 11 as an n-on-n+ type semiconductor substrate 1. Further, there is formed a p-type drain region 4 of the switch $T_S$ with a channel region 5 interposed between the source and drain regions 3 and 4. Reference numeral 8 designates an electrode of the photodiode PD formed on the surface of the semiconductor substrate 1 at the n+-type layer, numeral 6 a gate electrode of the switch $T_S$ formed on the channel region 5 through an $SiO_2$ film 9, numeral 7 a drain electrode of the switch $T_S$ formed on the drain region 4, and numeral 91 a surface protection or field oxide film. Usually, n couples of such photodiode PD and switch $T_S$ are fabricated in monolithic or hybrid IC configuration.

In operation, dispersed incident light components having different wavelengths impinge upon the photodiodes $PD_1$-$PD_n$ so that charges proportional to the amount of the incident light are stored at a photosensitive pn junction of each photodiode PD. Then, the switches $T_{S1}$-$T_{Sn}$ are successively turned on in response to sampling gate pulses from the shift registers $SR_1$-$SR_n$. The turn-on of one switch $T_S$ forms a closed series circuit which includes associated photodiode PD, the load resistor $R_L$ and the power supply $V_O$. By the formation of this series circuit, a charging current corresponding to the quantity of charges stored at the pn junction of the photodiode PD is supplied from the power supply $V_O$ through the resistor $R_L$ across which an output voltage is developed.

FIG. 1C shows the equivalent circuit of the charge storage type light sensor shown in FIG. 1A. In FIG. 1C, symbol $C_P$ designates the junction capacitance of photodiode PD, symbol $C_D$ a stray capacitance which includes the drain junction capacitance of switch $T_S$, the wiring or interconnection capacitance, etc., and symbol $R_{ON}$ the resistance of switch $T_S$ in its turned-on state. The stray capacitance $C_D$ is an important factor giving a great influence on the signal output characteristic of the light sensor. The reasons are as follows.

(1) Since the charging current to the junction capacitance $C_P$ of the photodiode PD contributing to photoelectric conversion may be supplied by charges stored in the stray capacitance $C_D$ as well as the power supply $V_O$, a large value of the stray capacitance $C_D$ results in the decrease of the charging current through the load register $R_L$, thereby lowering the level of a signal output voltage developed across the resistor $R_L$.

(2) The gate pulse applied to the switch $T_S$ from the shift register circuit SR may cause leakage through a capacitance between the gate and the drain, thereby generating large spike noises. A large value of the large stray capacitance $C_D$ results in large leading and tailing time constants of the noise pulses so that significant signals are buried in the large noise pulses, thereby rendering the signal detection impossible.

To attain the signal detection with high S/N ratio, it is necessary to separate or discriminate signals from noises. One conventional approach for that purpose was to juxtapose an additional counterpart with the above-described actual light sensor, the additional counterpart having the same configured photodiode, switch and shift register arrangement as the actual light sensor excepting that the photodiodes in the additional counterpart have their screened light receiving portions insensitive to light. Signals derived from adjacent juxtaposed photodiodes in the actual light sensor and the additional counterpart are passed through a differential amplifier to eliminate spike noises. This proposed construction is very complicated.

SUMMARY OF THE INVENTION

An object of this invention is to solve the above-mentioned problems and to provide a light detector device or sensor which provides high signal output as well as high S/N ratio.

According to this invention, a photodiode and an MIS transistor switch are formed on an insulating substrate such as sapphire. Source and drain regions of the MIS transistor switch reach the insulating substrate, thereby providing the reduced area of pn junctions and hence the reduced junction capacitance and further the reduced wiring capacitance.

DESCRIPTION OF THE PREFERRED EMBODIMENTS

Embodiments of this invention will be explained referring to FIGS. 2 and 3A–3E.

Figure 1B:
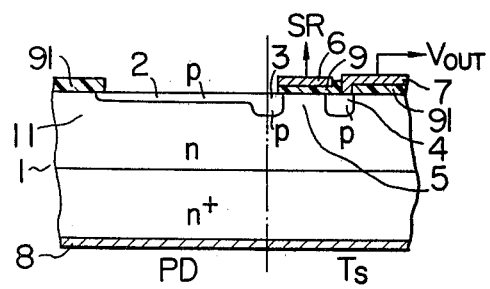
FIG. 1B shows in cross section the conventional structure of a photodiode and an MOS transistor switch which constitute one bit of the circuit shown in FIG. 1A.
Figure 1C:
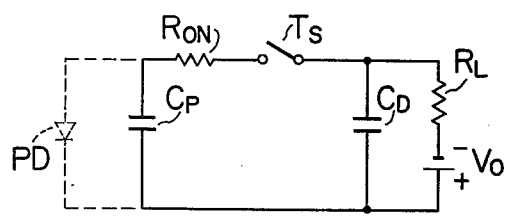
FIG. 1C shows the equivalent circuit of the charge storage type light sensor shown in FIG. 1A.
Figure 2:
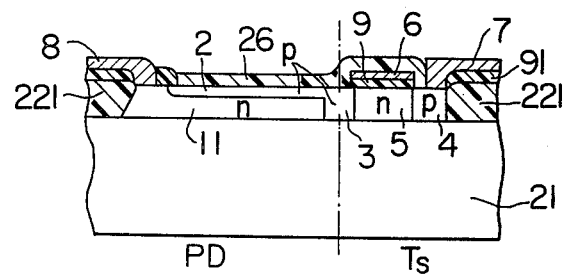
FIG. 2 shows in cross section the structure of a photodiode and an MOS transistor switch which constitute one bit of a charge storage type light sensor in accordance with one embodiment of this invention.

FIG. 2 shows the structure of a photodiode and MOS transistor switch which constitute one bit of a charge storage type light sensor in accordance with one embodiment of this invention. In FIG. 2, similar reference numerals and symbols are given to components equivalent to those shown in FIG. 1B. Referring to FIG. 2, a sapphire substrate 21 as an insulating substrate has thereon a photodiode PD and an MOS transistor switch $T_S$. A p-type silicon region 2 as a light receiving region of the photodiode is formed contiguously with a p-type source region 3 of the MOS transistor switch. In other words, the source region 3 of the MOS transistor switch is contiguous with the photosensitive pn junction of the photodiode. The photosensitive pn junction extends substantially parallel to the surface of the sapphire substrate 21. An electrode 8 is formed in ohmic contact with an n-type silicon region 11 of the photodiode, an electrode 7 for a light signal read out is formed in ohmic contact with a p-type drain region 4 of the MOS transistor switch, and a gate electrode 6 is formed through an $SiO_2$ film 9 on an n-type channel region 5 of the MOS transistor switch. Reference numeral 91 designates a field oxide film, and numeral 26 a light reflection preventing film. In FIG. 2, it should be noted that the source, drain and channel regions 3, 4 and 5 of the MOS transistor reach the sapphire substrate 21.

Figure 1A:
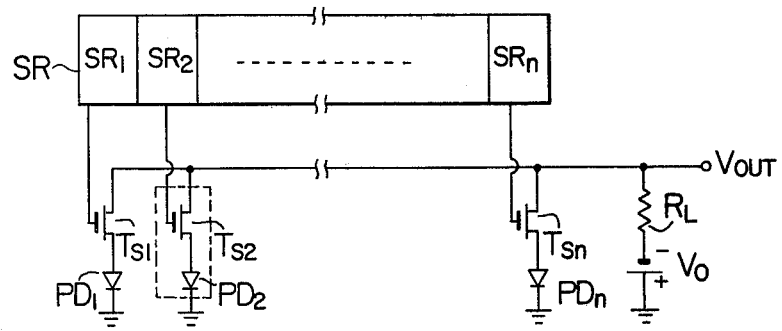
FIG. 1A shows the circuit arrangement of a charge storage type light sensor to which this invention can be applied.

Plural couples of such photodiode and MOS transistor switch may be formed on the sapphire substrate 21 while being isolated from each other by oxide layers 221, thereby completing a light sensor as shown in FIG. 1A.

As apparent from a comparison with the conventional structure shown in FIG. 1B, the structure of FIG. 2 according to the embodiment of this invention provide the greatly reduced area of pn junctions of the MOS transistor. In a light sensor comprising n couples of photodiode and MOS transistor, this reduction of junction area is very effective to decrease the above-mentioned stray capacitance $C_D$ since the largest part of the stray capacitance $C_D$ arises from the n-multiplied value of the drain junction capacitance of one MOS transistor switch $T_S$ which constitutes one bit of the light sensor. The stray capacitance $C_D$ is further decreased by the reduction of the wiring capacitance resulting from the facts that MOS transistors are formed on the insulating substrate and that the oxide layers 221 are provided. Though the peak value and peak time instant of an output signal pulse in the light sensor are determined by the resistance $R_{ON}$ of switch $T_S$ in its turned-on state, the load resistance $R_L$, the junction capacitance $C_P$ of photodiode PD and the stray capacitance $C_D$, the decrease of $C_D$ according to this invention can provide a high peak value of the output signal pulse. On the other hand, though the leading time, peak time instant and tailing time of a noise pulse are mainly determined by the load resistance $R_L$ and the stray capacitance $C_D$, the decrease of $C_D$ according to this invention can greatly shorten the leading and tailing times of the noise pulse. As a result, the signal pulse can be obtained with high value while the peak time instants of the signal and noise pulses can be separated without a substantial superposition of those pulses, thereby providing improved S/N ratio.

Figure 3A:
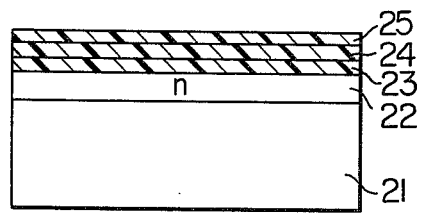
FIGS. 3A–3E show in cross section the successive process steps for fabricating the structure shown in FIG. 2.

FIGS. 3A–3E show the successive steps for fabricating the structure shown in FIG. 2. As shown in FIG. 3A, an n-type silicon layer 22 having the resistivity of 5 $\Omega$·cm and the thickness of 1.5 $\mu$m was epitaxially grown on a sapphire substrate 21. The preferred thickness of the layer 22 is 1 to 3 $\mu$m in view of the fabrication process of highly integrated elements and the optical property as will be described hereinafter. On the silicon layer 22 were then formed an $SiO_2$ film 23 through thermal oxidization process, an $Si_3N_4$ film 24 through CVD process and a second $SiO_2$ film 25 through CVD process.

Figure 3B:
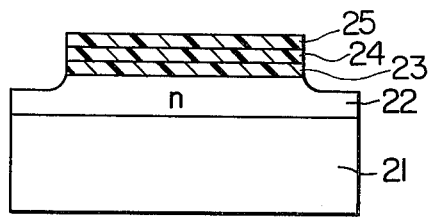
Figure 3C:
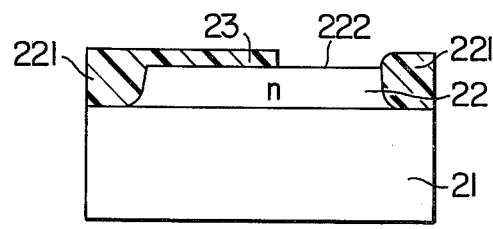
Figure 3D:
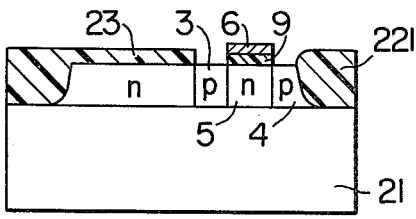

Thereafter, the selective etching of the $SiO_2$ film 23, the $Si_3N_4$ film 24 and the $SiO_2$ film 25 and the partial etching of the silicon layer 22 were made through well-known photoetching techniques, as shown in FIG. 3B.

After the remaining $SiO_2$ film 25 has been removed, the structure was heated so that the exposed surface portions of the silicon layer 22 are completely oxidized to form $SiO_2$ layers 221. Subsequently, the remaining $Si_3N_4$ film 24 was removed and a part of the $SiO_2$ film 23 was removed through photoetching process (see FIG. 3C).

Next, the exposed surface portion 222 of the silicon layer 22 was oxidized in a dry atmosphere of oxygen to form a clean $SiO_2$ film 9 of 1,000 Å thickness serving as a gate insulator, and a gate electrode 6 of polysilicon was formed with its thickness of 3,500 Å on the $SiO_2$ film 9. The polysilicon 6 and the $SiO_2$ film 9 were selectively removed through well-known photoetching process. Boron was diffused from the exposed portions of the silicon layer 22 to form p-type source and drain regions 3 and 4 of an MOS transistor (see FIG. 3D).

Figure 3E:
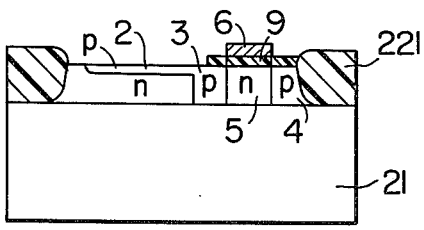

After the $SiO_2$ film 23 has been selectively removed through well-known photoetching process, boron was applied by thermal diffusion process to form a p-type silicon region 2 of a photodiode having its thickness of about 0.1 $\mu$m (see FIG. 3E). The region 2 may be formed by ion-implantation process. To obtain high sensitivity with respect to ultraviolet light, it is preferable that the thickness of the region 2 is smaller than 0.2 $\mu$m and the sheet resistance of the region 2 is about 800 to 3,000 $\Omega/\square$.

Subsequently, a light reflection preventing film 26 and electrodes 7 and 8 as shown in FIG. 2 were formed through well-known techniques, thereby completing the structure shown in FIG. 2.

In connection with the above-described fabrication process, one can properly refer to Japanese Patent Publication No. 37,308/74 published on Oct. 8, 1974 and assigned to RCA Corp. (corresponding to U.S. Ser. No. 65,154 filed on May 18, 1970) in which MOS transistors are formed on a sapphire substrate, and Japanese Patent Application Laid-Open No. 64,886/76 laid open on June 4, 1976 and assigned Sharp Co., Ltd. in which photodiodes are formed on a sapphire substrate.

The structure shown in FIG. 2 can operate in combination with the circuit arrangement shown in FIG. 1A. When in the absence of any incident light the MOS transistor switches $T_{S1}-T_{Sn}$ are successively turned on by sampling gate pulses from the scanning circuit SR, charges from the voltage source $V_O$ are stored in the junction capacitance $C_P$ of each associated photodiode PD. The stored charges are discharged by a photocurrent through the photodiode PD proportional to the amount of incident light irradiated thereon during when the associated switch $T_S$ is turned off. The quantity of charges equal to the discharged charges is supplied through the load resistor $R_L$ from the power supply $V_O$ when the associated switch $T_S$ is turned on by the next sampling gate pulse from the scanning circuit SR. At the same time, the quantity of the resupplied charges or the charging current through the load resistor $R_L$ is detected across the resistor $R_L$ as an output signal. Such output signals are time-sequentially derived from the photodiodes $PD_1-PD_n$ through the sequential turning-on operation of the switches $T_{S1}-T_{Sn}$ by the shift registers $SR_1-SR_n$.

Advantages obtainable from the above-described embodiment of this invention are as follows:

(1) Since the stray capacitance $C_D$ is decreased by the reduction of pn junction area of MOS transistor and the reduction of wiring capacitance, a high signal output is available.

(2) Since an output signal can be separated from spike noises, an improved S/N ratio is provided.

(3) Since adjacent bits or couples of photodiode and MOS transistor are isolated from each other by the oxide layers 221, the signal separation between bits is improved. In the conventional structure, light excited carriers generated at or in vicinity of the area of one bit might be collected to the neighbouring bit area, whereby so-called blooming phenomenon takes place.

(4) Since the stray capacitance $C_D$ is small, the time constant of operation as a light sensor governed by the charging and discharging of the capacitance is reduced, thereby enabling high speed operation.

(5) Since adjacent bits are completely isolated from each other by the $SiO_2$ layers 221 of narrow width, no provision of additional silicon regions for isolation are required, thereby permitting high degree of integration. In the conventional structure, an additional silicon region for isolation between adjacent bits was sometimes necessary and a relatively large spacing was required between the additional region and the active regions of the semiconductor elements since those regions are subjected to individual diffusion processes.

Usually, light from the visible range of shorter wavelengths to the ultraviolet range having its large absorption coefficient would be absorbed in an area distanced from the surface of a photodiode within about 0.1 $\mu$m. Therefore, the photodiode formed in the thin silicon layer 22 on the sapphire substrate 21 according to the described embodiment of this invention has its photoelectric conversion characteristic for shorter wavelength light which is comparable to that of the conventional photodiode. On the other hand, the photo-electric conversion characteristic of the photodiode for longer wavelength light is lowered since light from the visible range of longer wavelengths to the near infrared range has its absorption coefficient decreasing with the increase in wavelength. These characteristics are suitable to obtain a photocurrent output level which is approximately uniform over a range from shorter wavelengths to longer wavelengths, in a light measuring equipment such as a spectrophotometer which usually employs a tungsten lamp having its peak luminous intensity at near infrared wavelengths. The low sensitivity for longer wavelengths also provides a merit that unwanted effects caused by stray light of longer wavelengths are reduced in the detection of light of shorter wavelengths. Thus, it should be understood that the light detector according to this invention is useful as a detector for such a spectrophotometer.

Though the above embodiment has been described and shown to use n-channel MOS transistors, it is needless to say that p-channel MOS transistors may be used by forming a p-type epitaxial layer on the sapphire substrate. The oxide films of MOS transistors are not limited to be $SiO_2$ but another oxide such as $Al_2O_3$ or nitride such as $Si_3N_4$ may be equivalently used. Therefore, the switches may generally be MIS (Metal-Insulator-Semiconductor) transistors.

An array of photodiode-switch couples may take a one-dimensional configuration as shown in FIG. 1A, two-dimensional configuration, or other arbitrary configuration.

In the above embodiment, sapphire has been used for the insulating substrate. However, insulating substrate may comprise other materials such as spinel, diamond or silicon carbide.

As described above, a light sensor having high signal output and high S/N ratio is provided in accordance with this invention.

I claim:

1. A light detector device comprising a plurality of photodiode and MIS transistor couples arranged adjacent to each other on one surface of an insulating substrate, each photodiode and MIS transistor couple having a photodiode which includes a first semiconductor region of one conductivity type on and adjoining the insulating substrate surface, a second semiconductor region of an opposite conductivity type in said first region, said second and first regions forming therebetween a photosensitive pn junction substantially parallel to the insulating substrate surface, and an electrode in ohmic contact with said first region, and a MIS transistor which includes third and fourth semiconductor regions of said opposite conductivity type as source and drain regions on the insulating substrate surface, said third region being contiguous with said second region of said photodiode, a fifth semiconductor region of said one conductivity type between said third and fourth regions as a channel region on the insulating substrate surface, an insulating film on said fifth region, a gate electrode formed on said insulating film, and an electrode for light signal read out formed in ohmic contact with said fourth region, said third, fourth and fifth regions extending to and reaching the insulating substrate surface whereby a stray capacitance due to the capacitance of a pn junction formed between said third and fifth regions and the capacitance of a pn junction formed between said fourth and fifth regions is reduced, and the adjacent photodiode and MIS transistor couples being electrically and optically isolated from each other by a solid insulating material layer filled therebetween on the insulating substrate surface, whereby signal separation between the adjacent photodiode and MIS transistor couples is improved to prevent a blooming phenomenon.

2. A light detector device according to claim 1, wherein said insulating substrate comprises one selected from a group consisting of sapphire, spinel, diamond and silicon carbide.

3. A light detector device according to claim 2, further comprising shift register means connected to the respective gate electrodes of said MIS transistors for selectively enabling said MIS transistors, and light signal detecting circuit means including a series circuit of a load resistor and a power of supply one end of which series circuit is connected to the respective light signal read out electrodes of said MIS transistors.

4. A light detector device according to claim 1, wherein said first to fifth regions included in said phototransistor and MIS transistor couple have a substantially planar surface and the surface of said insulating material layer is higher than said planar surface.

5. A light detector device according to claim 4, wherein the height of said planar surface from said insulating substrate is 1 to 3 μm.

6. A light detector device according to claim 1 or 5, wherein said solid insulating material comprises silicon dioxide.

7. A light detector device according to claim 1, wherein the light signal read-out electrode of said MIS transistor extends on said insulating material layer, so that a stray capacitance due to wiring capacitance is reduced.

8. A light detector device comprising a plurality of semiconductor photodiode and MIS transistor couples formed adjacent to each other on an insulating substrate, each semiconductor photodiode and MIS transistor couple including a semiconductor photodiode which has therein a photosensitive pn junction and an MIS transistor which has source and drain regions of a first conductivity type, said source region being contiguous with said photosensitive pn junction, a channel region of second conductivity type between said source and drain regions, and a gate insulator film on said channel region, said source, channel and drain regions extending to and reaching said insulating substrate, wherein the adjacent semiconductor photodiode and MIS transistor couples are electrically and optically isolated from each other by a solid insulating material layer filled therebetween on said insulating substrate.

9. A light detector device according to claim 5, wherein the semiconductor photodiode and the MIS transistor source, channel and drain regions of said semiconductor photodiode and MIS transistor couple have a substantially planar surface and the surface of said insulating material layer is higher than said planar surface.

* * * * *